(12) United States Patent
Khellah et al.

(10) Patent No.: US 6,801,463 B2
(45) Date of Patent: Oct. 5, 2004

(54) METHOD AND APPARATUS FOR LEAKAGE COMPENSATION WITH FULL VCC PRE-CHARGE

(75) Inventors: Muhammad M. Khellah, Lake Oswego, OR (US); Yibin Ye, Portland, OR (US); Dinesh Somasekhar, Hillsboro, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 10/273,627

(22) Filed: Oct. 17, 2002

(65) Prior Publication Data

US 2004/0076059 A1 Apr. 22, 2004

(51) Int. Cl.[7] .................................................. G11C 7/00
(52) U.S. Cl. ...................................... 365/203; 365/154
(58) Field of Search ................................ 365/203, 154, 365/207, 196, 189.11

(56) References Cited

U.S. PATENT DOCUMENTS

| | | | | |
|---|---|---|---|---|
| 4,858,195 A | * | 8/1989 | Soneda | 365/205 |
| 5,517,452 A | * | 5/1996 | Mehalal | 365/203 |
| 6,501,687 B2 | * | 12/2002 | Choi | 365/189.11 |
| 6,608,786 B2 | * | 8/2003 | Somasekhar et al. | 365/203 |
| 6,707,708 B1 | * | 3/2004 | Alvandpour et al. | 365/154 |

OTHER PUBLICATIONS

A Bit–Line Leakage Compensation Scheme For Low–Voltage Srams Agawa, K.; Hara, H.; Takayanagi, T.; Kuroda, T. VLSI Circuits, 2000. Digest of Technical Papers. 2000 Symposium on, 2000 pp. 70–71.*

* cited by examiner

*Primary Examiner*—Anh Phung
(74) *Attorney, Agent, or Firm*—Cynthia T. Faatz

(57) ABSTRACT

A leakage compensation approach enabling full $V_{CC}$ pre-charge. An array of memory cells is coupled between a pair of bit lines. A precharge circuit precharges the pair of bit lines to substantially a supply voltage level and a leakage compensation circuit supplies a first compensation current to a first one of the bit lines to substantially compensate for leakage current supplied by the first bit line during a memory access operation directed to one of the plurality of memory cells.

17 Claims, 7 Drawing Sheets

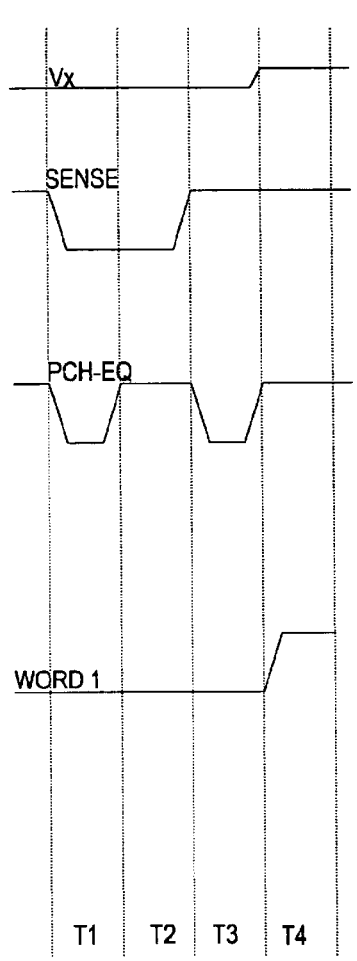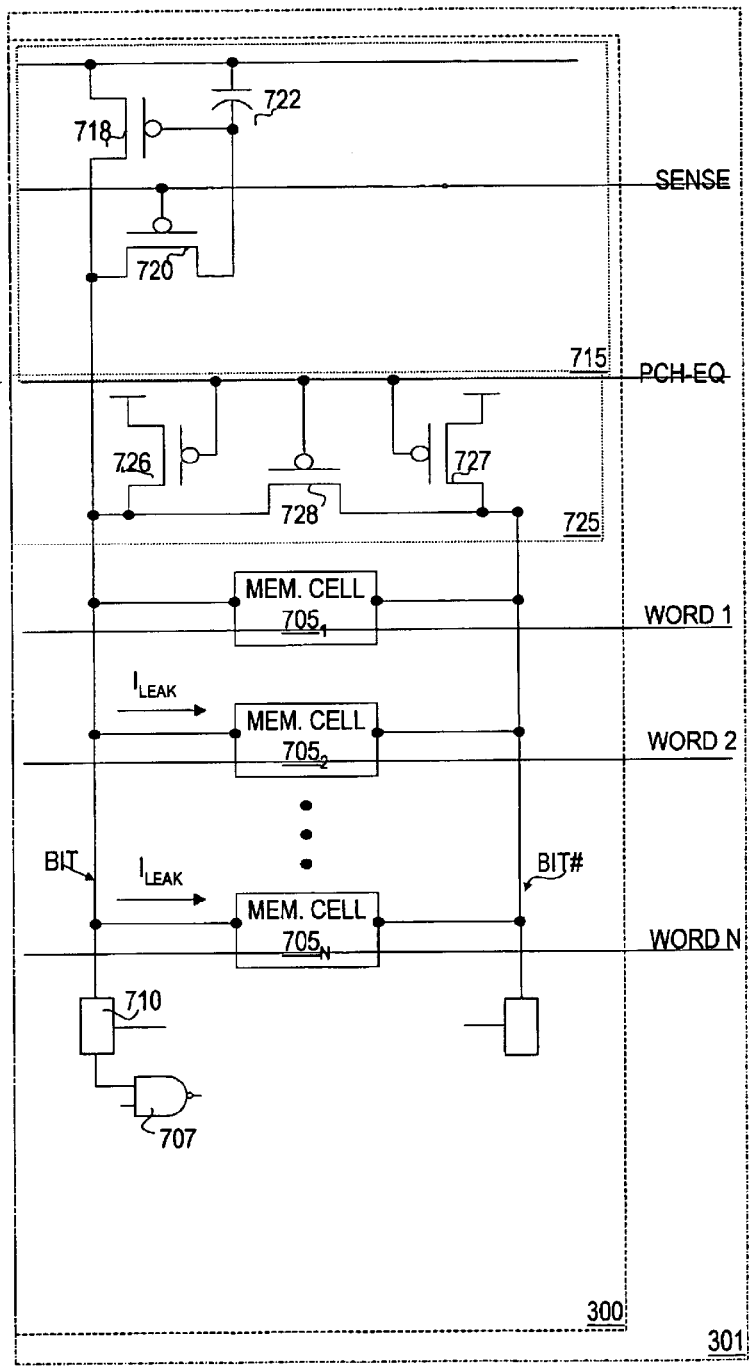
FIGURE 8                    FIGURE 7

METHOD AND APPARATUS FOR LEAKAGE COMPENSATION WITH FULL VCC PRE-CHARGE

CROSS-REFERENCE TO RELATED APPLICATION

The present application is related to U.S. patent application Ser. No. 09/823,575 entitled, "Apparatus and Method for a Memory Storage Cell Leakage Cancellation Scheme," filed Mar. 30, 2001, now U.S. Pat. No. 6,608,786, issued on Aug. 19, 2003 and assigned to the assignee of the present invention.

BACKGROUND

An embodiment of the present invention relates to the field of integrated circuits, and more particularly, to an approach for leakage current compensation.

Static random access memory (SRAM), which is designed to coexist on the same die as a high performance logic process, is increasingly susceptible to leakage in metal oxide semiconductor (MOS) devices. Continued scaling of device sizes to improve the performance of logic has resulted in a significant increase in leakage currents.

To achieve high density, SRAMs often include a large number of bit-cells in a single column, which is typically implemented with a pair of differential bit-lines. Such an SRAM relies on the development of a differential voltage on a selected bit-line pair in response to a memory read operation directed to the SRAM. To develop the differential voltage, the bit-lines are first pre-charged to the power supply rails and the particular bit-cell on the corresponding column is selected. The selected bit-cell then discharges one of the bit-lines, depending on the value stored in the selected cell, with a total bit-line capacitance CbI and a discharge current of Idrive.

Where N cells are in a column, the unselected N−1 cells contribute a leakage current of N−1 times a leakage current Ileak. For this example, the voltage differential between the bit-lines develops at the rate $$dv/dt = (Idrive - (N-1)*Ileak)/CbI \qquad \text{(Eqn. 1)}$$

For higher leakage currents, (N−1)*Ileak may be large enough to be capable of discharging the other bit-line of the differential bit-line pair.

As can be seen from Equation 1, increasing leakage currents lead to a reduction in the rate of swing development and, in fact, may reach a point at which the leakage current completely swamps the drive current.

One approach to addressing this issue is to reduce the number of memory cells per column of memory, i.e. decrease the value of N in the above example. This solution, however, reduces array efficiency and leads to an increase in area for the SRAM. Other types of circuitry, including, for example, register files and certain types of domino logic, for example, may also be adversely affected by device leakage.

BRIEF DESCRIPTION OF THE DRAWINGS

The present invention is illustrated by way of example and not limitation in the figures of the accompanying drawings in which like references indicate similar elements, and in which:

FIG. 7 is a schematic diagram of a portion of an SRAM of another embodiment that provides for leakage compensation with full-$V_{CC}$ precharge in a single-ended sensing SRAM that may be used to provide the SRAM of FIG. 1.

FIG. 8 is a timing diagram showing exemplary relative timings of control signals that may be used to control the SRAM of FIG. 7 and a voltage level of an exemplary bit-line.

DETAILED DESCRIPTION

A method and apparatus for leakage compensation, which also provides for full-$V_{CC}$ pre-charge, is described. In the following description, particular types of memories, memory cells, circuit configurations, systems and integrated circuits are described for purposes of illustration. It will be appreciated, however, that other embodiments are applicable to other types of memories, memory cells, circuit configurations, systems and/or integrated circuits.

For one embodiment, an array of memory cells is coupled between a pair of bit lines. A precharge circuit is provided to precharge the pair of bit lines to a full supply voltage level. A leakage compensation circuit supplies a first proportional compensation current to at least a first one of the bit lines to substantially compensate for leakage current on the at least first bit-line during a memory access operation directed to one of the plurality of memory cells.

Figure 1:
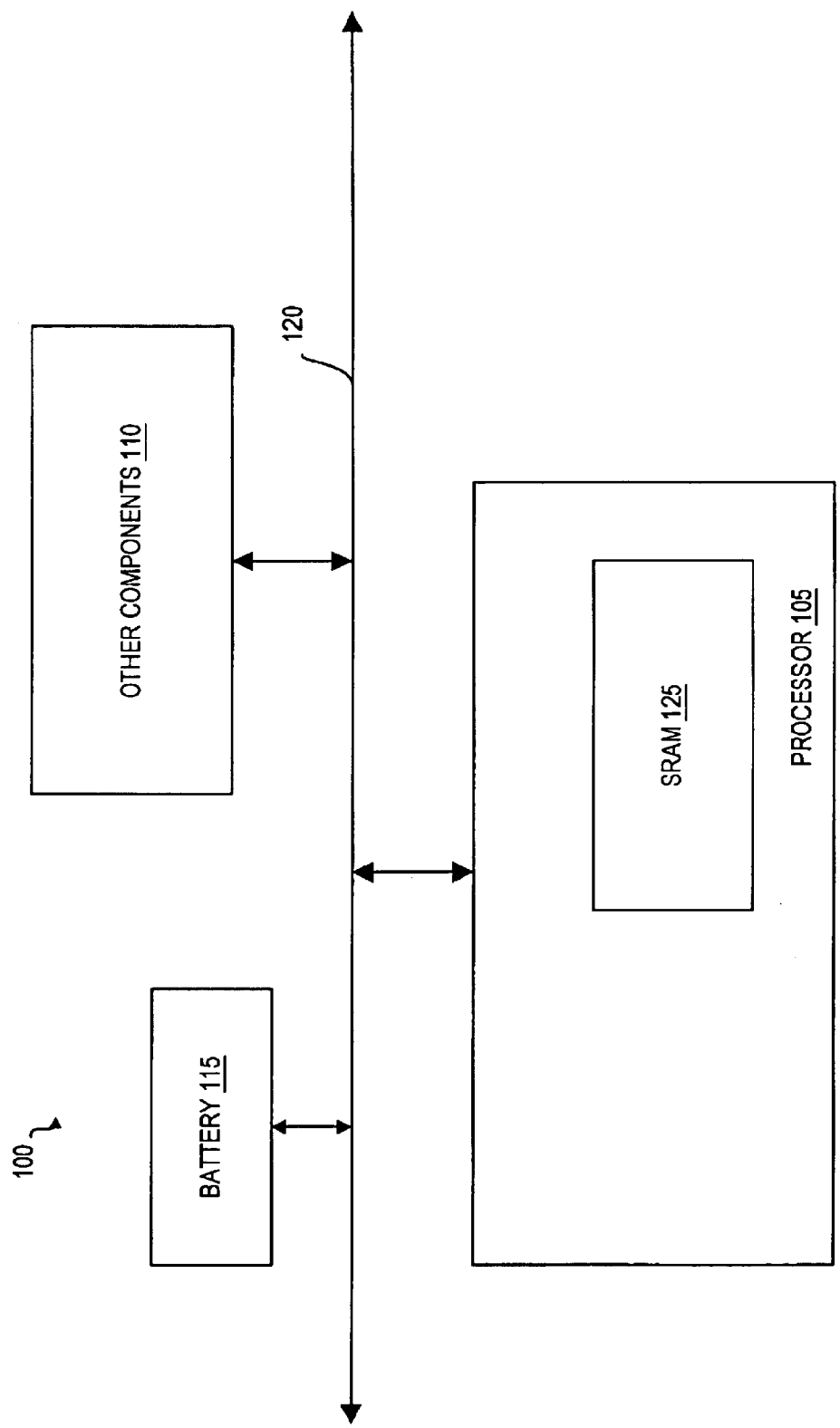
FIG. 1 is a block diagram of a system including a processor having a static random access memory (SRAM).

FIG. 1 is a block diagram of system 100 including a processor 105 to execute instructions, other components 110 to provide a variety of other functions, and a battery 115, each coupled to a bus 120. The processor 105 may be any type of processor such as, for example, a microprocessor, a digital signal processor, an embedded processor or a graphics processor. For one embodiment, the processor 105 includes at least a first static random access memory (SRAM) 125 that may, for example, be used to provide an onboard cache memory to store frequently and/or recently used instructions for use by the processor 105.

The other components 110 may include several different components such as one or more input and/or output devices, additional memory, memory control, graphics capabilities, additional buses, etc. Other types of components may also be included.

For one embodiment, the system 100 is a mobile system for which the battery 115 provides power when the system is not connected to another power source. It will be appreciated that different types of system that may be configured in a different manner and may or may not include a battery are within the scope of various embodiments. Further, it will be appreciated that while an SRAM of various embodiments may be provided on a processor as shown in FIG. 1, for other embodiments the disclosed SRAM(s) may be implemented on a different type of integrated circuit device.

Figure 2:
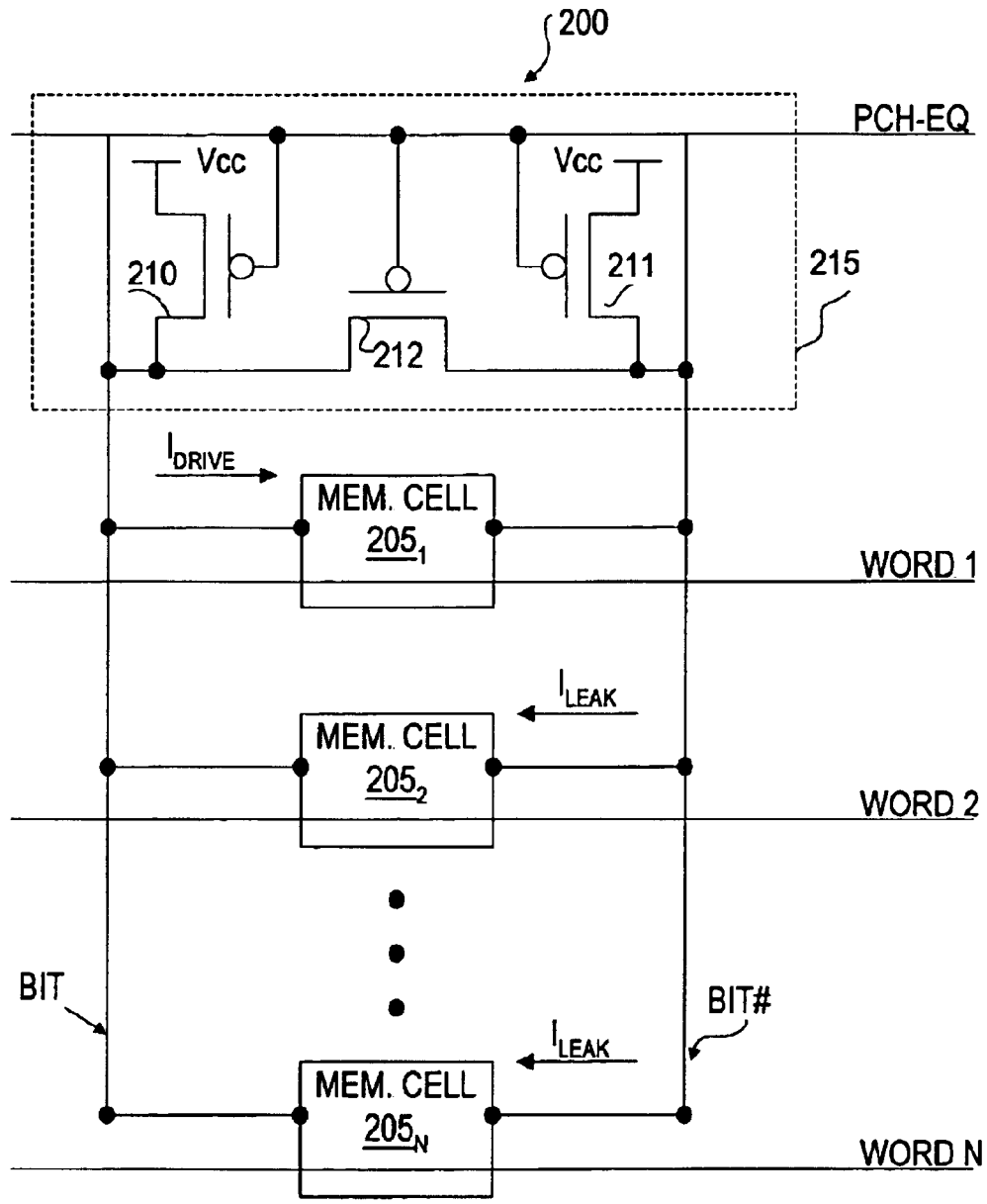
FIG. 2 is a schematic diagram of a portion of a conventional SRAM.

FIG. 2 is a schematic diagram showing one column 200 of a prior SRAM that may be used, for example, to provide the SRAM 125 of FIG. 1. The SRAM column 200 includes N 6-transistor random access memory (RAM) cells $205_1$–$205_N$ that may be selectively activated by activating associated word-lines Word1–WordN. Transistors 210–212 form a precharge and equalization circuit 215 to precharge and equalize bit-lines BIT and BIT# to the positive power supply ($V_{CC}$) rail.

FIG. 2 also shows a worst-case leakage situation for the SRAM column 200. For the illustrated leakage situation, during a memory read operation, a selected cell, RAM cell $205_1$ in this example, provides a pull-down current of Idrive on one of the bit-lines, while the remaining N−1 cells that are not selected provide a current substantially equal to (N−1) times Ileak on the other bit-line. As described above, it is possible for the overall leakage current to become so large that the time it takes for a differential voltage to develop on the bit-lines is unacceptable and/or leads to performance degradation of the SRAM.

Figure 3:
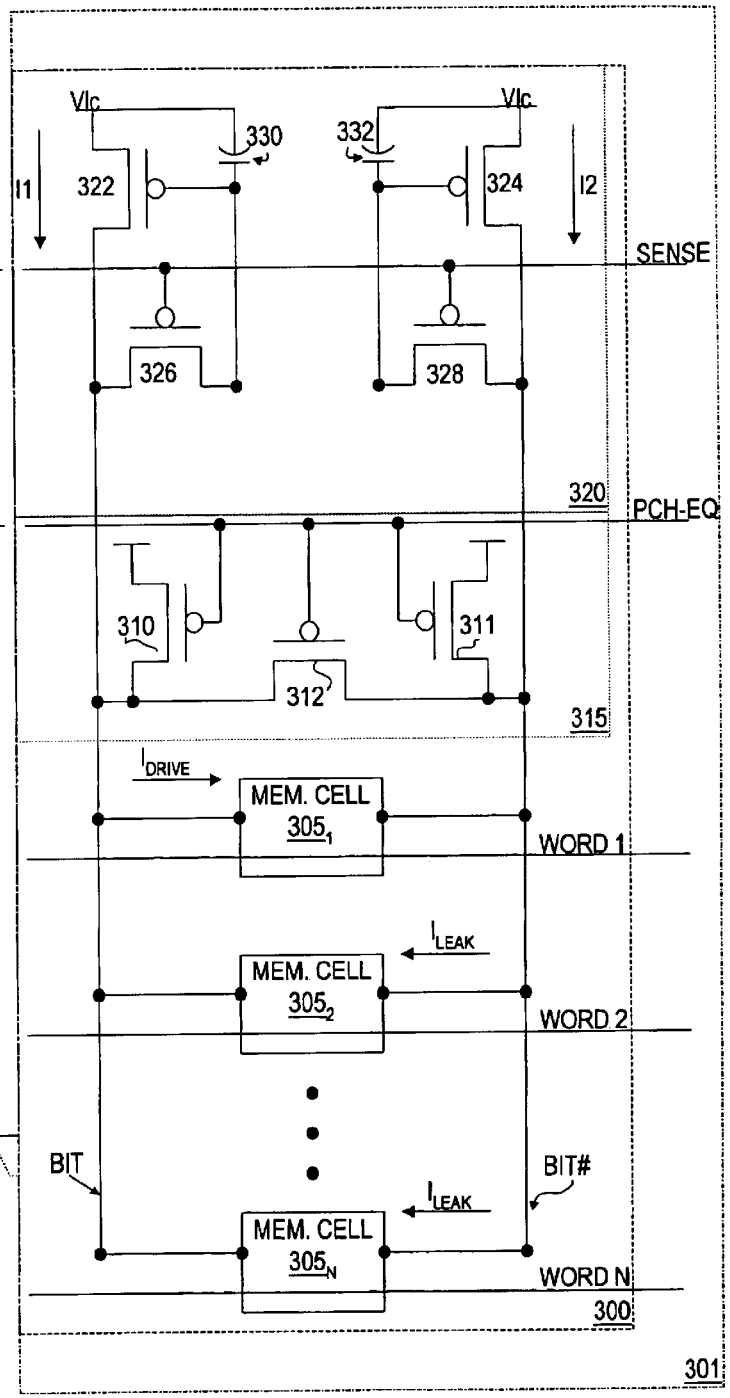
FIG. 3 is a schematic diagram of a portion of an SRAM in accordance with one embodiment that implements bit-line compensation and full $V_{CC}$ precharge that may be used to provide the SRAM of FIG. 1.

FIG. 3 is a schematic diagram of one column 300 of an exemplary SRAM 301 of one embodiment that may be advantageously used to provide the SRAM 125 of FIG. 1, or another SRAM for a different application, and that addresses the leakage issue discussed above. It will be appreciated that other similar columns may be provided in the SRAM 301.

The exemplary SRAM column 300 includes SRAM memory cells $305_1$–$305_N$, where N may be any positive integer. Similar to the prior SRAM described above, each of the memory cells $305_1$–$305_N$ is coupled to a differential bit-line pair provided by bit lines BIT and BIT# as shown, and may be selectively activated in response to asserting an associated word line Word1–WordN. The exemplary SRAM column 300 also includes transistors 310–312 that form a precharge and equalization circuit 315 that is substantially similar in operation to the precharge circuit 215 of FIG. 2 except for the differences discussed below.

In contrast to the prior SRAM of FIG. 2, however, the exemplary SRAM column 300 includes a bit-line precharge, sensing and leakage compensation circuit 320, alternately referred to herein simply as a bit-line compensation circuit 320 or a bit-line compensation circuit with full $V_{CC}$ precharge. The bit-line compensation circuit 320 includes $V_{CC}$ pre-charge, sensing and leakage compensation transistors 322 and 324, each of which has a source terminal connected to receive a supply voltage $VI_C$ that is higher than the supply voltage $V_{CC}$ used to power nearby circuitry and the remainder of the SRAM.

For one embodiment, $VI_C$ is supplied by a voltage supply separate from the $V_{CC}$ voltage supply. The $VI_C$ supply may also be used by other circuitry (not shown) for other purposes such that an additional supply that is only used for the SRAM may not be necessary. The bit-line compensation circuit 320 also includes sample and hold switching transistors 326 and 328 and capacitors 330 and 332, each of which is coupled in the manner shown in FIG. 3.

For one embodiment, the sample and hold switching transistors 326 and 328 are sized such that, during a sense operation, the effective voltage across the transistors 326 and 328 is zero (i.e. effectively a short). The sizes of the sensing and compensation transistors 322 and 324 is determined, at least in part, based on the amount of time available for the sense operation, while the sizes of the precharge devices 310 and 311 are determined, at least in part, based on the amount of time available for worst-case precharge, which, for a typical differential SRAM, occurs after a write operation.

Figure 4:
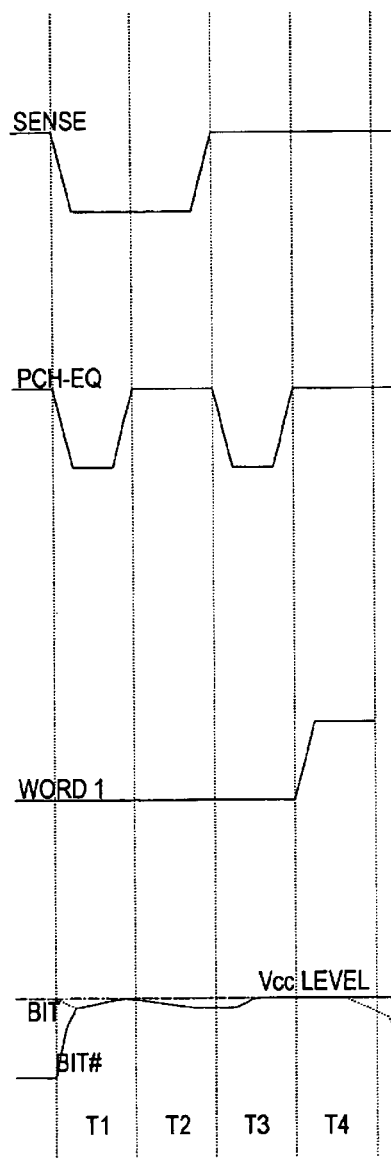
FIG. 4 is a timing diagram showing exemplary relative timings of control signals that may be used to control the SRAM of FIG. 3 and exemplary voltage levels of the bit-lines.

FIG. 4 is a timing diagram showing exemplary control signal timings for the SRAM column 300 of FIG. 3 and exemplary relative voltage levels for the bit-lines BIT and BIT#. Referring to FIGS. 3 and 4, in operation, following a prior memory access operation, during a first phase indicated in FIG. 4 by the time period T1, sense enable (sense) and precharge-equalize (PCH-EQ) signals are asserted (i.e. they transition low in this example.)

In response to the SENSE signal transitioning low, switching transistors 326 and 328 are enabled such that the gate and drain of the sensing and compensation transistor 322 are effectively shorted together and the gate and drain of the sensing and compensation transistor 324 are effectively shorted together. Shorting the gates and drains of each of the sensing and compensation transistors 322 and 324 together acts to place each of the transistors 322 and 324 in a diode-connected configuration, i.e. enables each of the transistors 322 and 324 as an active load. The drain-to-source voltage $V_{DS}$ of an active load may be approximated as:

$$V_{DS}=V_{GS}=V_T+(I_{DS}/B)^{0.5} \qquad \text{(Eqn. 2)}$$

where: 1) $V_{GS}$ is the gate-to-source voltage of the transistor; 2) $V_T$ is the threshold voltage of the transistor; 3) $I_{DS}$ is the drain-to-source current; and 3) B is the transconductance of the transistor.

For small drain-to-source currents $I_{DS}$, it will be noted that the drain-to-source voltage $V_{DS}$ approaches $V_T$. For such cases, for the embodiment of FIG. 3, the precharge voltage on the bit lines BIT and BIT# is substantially equal to $VI_C-V_T$, where $VI_C$ may be selected such that $VI_C-V_T=V_{CC}$, i.e. $VI_C=V_{CC}+V_T$. Thus, by coupling the sources of the precharge transistors 322 and 324 to $VI_C$, the bit-lines BIT and BIT# may be precharged to the full $V_{CC}$ level in accordance with the embodiment shown in FIG. 3 while still providing leakage compensation as described in more detail below.

With continuing reference to FIGS. 3 and 4, in response to the PCH-EQ signal transitioning low, the transistors 310, 311 and 312 are also enabled to precharge (in conjunction with the transistors 322 and 324) and equalize the bit lines BIT and BIT#. Turning on the transistors 310 and 311, which act as the primary precharge transistors for the embodiment shown in FIG. 3, causes the bit lines to be coupled to $V_{CC}$ through the transistors 310 and 311. Turning on the transistor 312 effectively creates a short circuit between the bit-lines BIT and BIT#, which causes the bit-lines to be equalized, i.e. to have an approximately equal potential.

Asserting the SENSE signal along with the PCH-EQ signal during the phase T1 further operates to precharge and equalize the capacitors 330 and 332 prior to a sensing operation.

During a second phase indicated by T2 in FIG. 4 and referred to herein as a sense phase, the PCH-EQ signal is de-asserted (i.e. pulled high in the embodiment shown) such that the transistors 310–312 are disabled and the bit-lines BIT and BIT# are isolated from each other. During this sense phase, the transistor 322 supplies any leakage current on the BIT line while the transistor 324 supplies any leakage current on the BIT# line.

If it is assumed, for example, that M cells leak on the BIT side and N-M cells leak on the BIT# side, given sufficient sense time, I1 will be equal to M*Ileak while I2 will be equal to (N-M)*Ileak where it is approximated for simplicity that the leakage current Ileak for each of the storage cells 305 is the same. Because the transistors 322 and 324 appear as diode-connected metal oxide semiconductor field effect transistors (MOSFETs), the gates of the transistors 322 and 324 have the voltage required to sustain the respective leakage currents.

It will be appreciated that, with reference to Equation 2, if I1 does not equal I2, the gate-to-source voltages $V_{GS}$ for the transistors 322 and 324 will differ and thus, the voltage on the bit-lines BIT and BIT# will differ. This is because, as active loads, $V_{GS}=V_{DS}$ for each of the transistors 322 and 324 such that a difference in gate-to-source voltage corresponds to a difference in drain-to-source voltage resulting in different voltages on the respective bit-lines.

During a third phase indicated by T3 in FIG. 4, the SENSE signal is deasserted (i.e. taken high in this example) such that the transistors 326 and 328 are turned off. Turning off the transistors 326 and 328 causes the voltages on the gates of the transistors 322 and 324 to be maintained. Further, the capacitors 330 and 332, which, for one embodiment are metal oxide semiconductor (MOS) capacitors, are large enough to maintain steady the voltages at the gates of the transistors 322 and 324. For one embodiment, the sizes of the capacitors are selected such that they are capable of maintaining the gate voltages at the transistors 322 and 324 despite subthreshold leakage, gate leakage and charge injection when the transistors 326 and 328 are turned off. Where the capacitors are gate-based, leakage of the capacitors themselves must also be taken into consideration in sizing decisions. For one embodiment, the number of cycles for which the capacitors need to maintain a charge is taken into consideration as well.

Also during this third phase, the PCH-EQ signal is again asserted to enable the transistor 312 to equalize the bit-lines BIT and BIT# while the leakage supply currents I1 and I2 are maintained. The bit-lines are equalized at this point due to the difference in voltage that may develop on the bit-lines as a result of the sense operation and of separately supplying the leakage currents as described above. Asserting the PCH-EQ signal also enables precharge devices 310 and 311 to pull the bit-lines to $V_{CC}$ as shown in FIG. 4.

In a fourth phase indicated in FIG. 4 by T4, data is read from a selected memory cell 305. For purposes of example, it is assumed that the memory cell $305_1$ is selected to be read and is storing a 0. During the exemplary data read operation, the SENSE and PCH-EQ signals are de-asserted and the word line signal associated with the selected cell (Word1 in this example) is activated. In response to activating the Word1 signal, the memory cell $305_1$ pulls drive current Idrive from the BIT line such that its voltage is pulled down.

Because, as described above, the leakage currents associated with each of the non-selected memory cells $305_2$–$305_N$ are supplied by the transistors 322 and 324, the differential development rate for the bit-lines BIT and BIT# during the read operation is substantially equivalent to the rate provided by Equation 1 where Ileak=0. Thus, the SRAM 301 of one embodiment provides for leakage compensation with full $V_{CC}$ pre-charge such that the SRAM 301 may provide for higher performance than a similar SRAM that does not provide such capabilities.

The use of a voltage higher than $V_{CC}$ for leakage compensation in this embodiment provides an approach that enables leakage compensation while maintaining the advantages of full $V_{CC}$-precharge. For prior leakage compensation approaches in which bit-lines are precharged to a voltage less than $V_{CC}$, the drive current is smaller such that the bit-line development rate is slower. Further, the bit-lines are more susceptible to noise coupling and current injection from adjacent devices and from any buses running over the SRAM. This can prevent proper operation of the leakage compensation circuitry because the compensating devices may not have a high enough Vds to cause the compensating current to conduct.

For one embodiment, the sensing operation of the second phase (T2) and the subsequent precharge and equalization operation of the third phase (T3) described above do not need to be performed following every memory access operation to the SRAM 301. The magnitude of the leakage currents associated with the individual bit-lines BIT and BIT# typically only changes appreciably following a write operation. For some implementations, an adjustment to the leakage compensation currents I1 and/or I2 is only required following a given number of writes.

Thus, control circuitry (not shown) that provides the SENSE and PCH-EQ signals may be configured in such a manner that the SENSE operation of the second phase and the subsequent precharge and equalization operations of the third phase are only enabled after a write operation to the SRAM 301, or for some embodiments, after every predetermined number of write operations.

Figure 5:
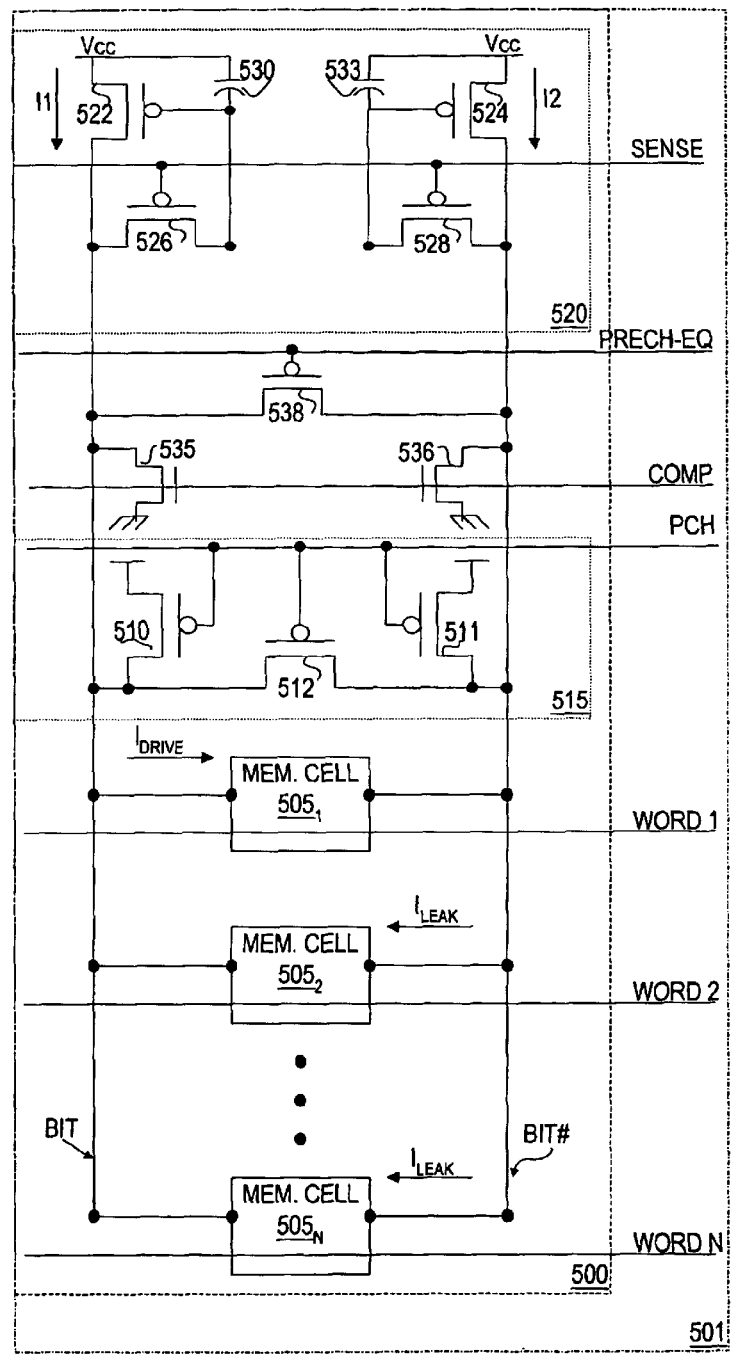
FIG. 5 is a schematic diagram of a portion of an SRAM in accordance with one embodiment that implements bit-line compensation and full $V_{CC}$ precharge that may be used to provide the SRAM of FIG. 1.

FIG. 5 is a schematic diagram of a column 500 of an exemplary SRAM 501 of another embodiment that may alternatively be used to provide the SRAM 125 of FIG. 1 or another memory for another application. The exemplary SRAM column 500 includes memory cells $505_1$–$505_N$, where N may be any positive integer.

The SRAM 501 column 500 includes a precharge, sense and leakage compensation circuit 520 that is similar in configuration and operation to the corresponding circuit 320 of FIG. 3. Leakage sensing and precharge transistors 522 and 524 of the precharge, sense and leakage compensation circuit 520, however, have their sources coupled to receive the supply voltage $V_{CC}$. For another embodiment, the sources of the transistors 522 and 524 are coupled to receive a voltage $VI_C$ that is equal to $V_{CC}+V_T$ as described above in reference to FIG. 3. The precharge, sense and leakage compensation circuit 500 further includes sample and hold switching transistors 526 and 528 and capacitors 530 and 533.

The SRAM column 500 also includes a precharge and equalization circuit 515 that is similar in configuration and operation to the corresponding circuit 315 of FIG. 3. The precharge and equalization circuit 515 includes precharge devices 510 and 511 and an equalization device 512. Each of the precharge devices 510 and 511 has a source terminal coupled to $V_{CC}$.

Additionally, the SRAM column 500 includes pull-down devices 535 and 536, and another equalization device 538. The operation and function of each of these devices is described in more detail below.

Figure 6:
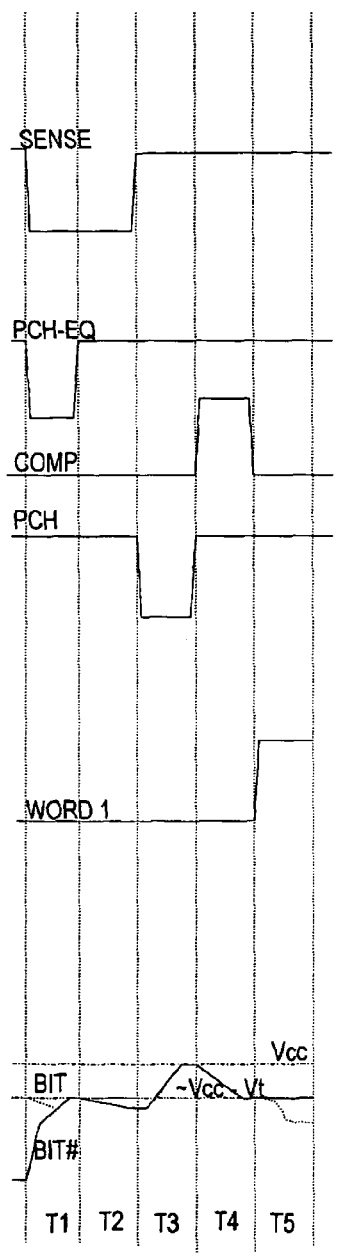
FIG. 6 is a timing diagram showing exemplary relative timings of control signals that may be used to control the SRAM of FIG. 5.

FIG. 6 is a timing diagram showing exemplary timings for control signals used to control the operation of the SRAM column 500 and exemplary relative voltage levels for the bit-lines throughout the various phases.

Referring to FIGS. 5 and 6, for one embodiment, after a prior memory read or write operation, in a first phase indicated by T1 in FIG. 6, sense enable (sense) and equalization (PRECH-EQ) signals are asserted (i.e. taken low). As for the above-described embodiment, asserting the SENSE signal causes the sample and hold switching transistors 526 and 526 to be enabled to place the precharge and leakage compensation transistors 522 and 524 in an active load configuration. Because the source terminals of each of the devices 522 and 524 are coupled to $V_{CC}$, enabling the transistors 522 and 524 in the active load configuration causes the bit lines BIT and BIT# to be precharged to a voltage level substantially equal to $V_{CC}-V_T$ (where $V_T$ is the threshold voltage of the respective diode-connected transistor 522 or 524).

In response to the PRECH-EQ signal being asserted, the equalization transistor 538 is enabled to equalize the bit-lines BIT and BIT# and to equalize the initial voltages on the capacitors 530 and 533.

A sense phase begins at a second phase indicated by T2 in FIG. 6 when the PRECH-EQ signal is taken high. In response to the PRECH-EQ signal being taken high, the equalization transistor 538 is turned off and the bit-lines are effectively isolated from each other. During the sense phase, as described above, the precharge and leakage compensation transistor 522 supplies the leakage current I1 for the BIT line, while the transistor 524 supplies the leakage current I2 for the BIT# line.

As for the above-described embodiment, if it is assumed that M cells leak on the BIT side and N-M cells leak on the BIT# side, with sufficient sense time, I1 is equal to M*Ileak, while I2 is equal to (N-M)*Ileak where it is assumed for simplicity that the leakage current Ileak for each memory cell 505 is the same. Because the devices 522 and 524 appear as diode-connected MOSFETs, the gates of the transistors 522 and 524 are at the proper voltage necessary to sustain the respective leakage current.

In a third phase indicated by T3 in FIG. 6, the SENSE signal is deasserted such that the devices 526 and 528 are turned off and the voltages on the gates of the precharge and leakage compensation devices 522 and 524 are held. For one embodiment, as described above, the capacitors 530 and 533 are provided by MOS capacitors that are designed to be large enough to maintain the voltages at the gates of the transistors 522 and 524 even with gate leakage and charge injection that may occur when the transistors 526 and 528 are disabled.

Also in the third phase, a precharge (PCH) signal is asserted to enable the precharge and equalization devices 510–512 to equalize and precharge the bit-lines all the way to $V_{CC}$ as shown in FIG. 6.

A fourth phase, indicated by T4 in FIG. 6, begins an evaluation phase. For this phase, SENSE, PRECH-EQ and PCH signals are all deasserted. At the beginning of this evaluation phase, leakage compensation transistors 522 and 524 are off and sufficient drain-to-source current $I_{DS}$ must be developed before they start to source leakage compensation current. To accomplish this, a compensation (COMP) signal is pulsed long enough to pull down both bit-lines BIT and BIT# to slightly lower than $V_{CC}$. For one embodiment, around 3 kT/q=100 mV may be sufficient to cause the devices 522 and 524 to operate as current sources.

In a fifth phase, indicated by T5 in FIG. 6 and referred to herein as a read or evaluation phase, a read operation begins by driving a selected word line. For purposes of example, it is assumed that the read operation is directed to the memory cell $505_1$ such that the word line Word1 is asserted as shown. Because the gate-to-source voltages of the transistors 522 and 524 determine the respective magnitudes of each of the leakage compensation currents I1 and I2, approximately the same current that was provided in the sense phase is also provided in the evaluation/read phase. As described above, the currents I1 and I2 compensate for the leakage currents on the respective bit-lines such that the differential development rate on the signal lines is substantially equivalent to that provided by Equation 2 above where the leakage current is 0.

As for the embodiment described in reference to FIGS. 3 and 4, the SRAM 501 of FIGS. 5 and 6 may be controlled by control signals that cause a sense operation to occur only after a write operation or only after a predetermined number of write operations. For cycles for which a sense operation is not performed, between memory access operations, the bit-lines may simply be precharged and equalized between memory access operations by the transistors 510–512 in response to asserting the PCH line such that the larger precharge and calibrate (i.e. determine the leakage compensation currents) penalties do not have to be applied to every memory access cycle.

Using the above-described approach, it may be possible to improve memory performance as compared to prior implementations that do not provide for full $V_{CC}$ precharge of the bit lines. Full $V_{CC}$ precharge prior to a memory access operation, in conjunction with leakage compensation as provided by the embodiments described herein enables a higher read current and faster bit line differential development rate where applicable such that overall delay may be improved.

Further, for the above-described embodiments, in contrast to some prior approaches, the bit lines are prevented from floating following precharge. In particular, for a large memory with many blocks, the precharge signal of a given block typically stays on unless that block is selected in response to a read or write operation. Maintaining the precharge signal prevents any coupling to the bitlines of unselected blocks. In the case of precharging through a diode where a full $V_{CC}$ precharge approach, such as that described above is not used, the diode will turn off when the bit-line reaches $V_{CC}$-Vth such that the bit-line may be left floating. A floating bit-line is susceptible to noise such that the leakage compensation circuitry may not operate correctly. Using the full $V_{CC}$ precharge approach described above, such a situation is prevented from occurring.

A bit-line leakage compensation scheme with full $V_{CC}$ precharge of another embodiment is shown in and described in reference to FIGS. 7 and 8. FIG. 7 shows an exemplary column 700 of an SRAM 701 that may alternatively be used to provide the SRAM 125 of FIG. 1. The SRAM column 700 includes SRAM cells $705_1$–$705_N$, where N may be any positive integer. Unlike the SRAMs of the previously-described embodiments, the SRAM 701 is a single-ended sensing SRAM. For differential sensing SRAMs, the rate of bit-line voltage differential development is important. In SRAMs with single-ended sensing, large leakage currents in bit-lines introduce potentially severe noise margin issues.

For example, referring to FIG. 7, for the pair of bit-lines BIT and BIT#, one of the bit-lines, the BIT line for the exemplary embodiment shown in FIG. 7, is sensed through a highly skewed inverter or NAND gate 707 in which p-channel MOS (PMOS) transistors are substantially stronger than n-channel MOS (NMOS) transistors. Depending on the particular SRAM 701 organization, a pass gate or a transmission gate 710 controlled by a column select ($COL_{13}$ SEL) signal may be used for each column to select the column(s) to be read out.

The skewed gate 707 has a relatively high trip point so that the gate will start to switch early when the bit-line voltage goes down in an evaluation phase, and hence, it increases the performance of the SRAM 701. The skew of the gate 707 is mainly limited by the worst-case noise margin, which occurs when a logic value "1" is being read out. When the cell being read stores a "1," the bit-line voltage needs to stay high so that the sensing gate will not switch. The bit-line, however, is being pulled down by the leakage current of (N−1)*Ileak for a worst-case example. For this example, the voltage droop on the bit-line is approximately (N−1)*Ileak*T/Cbit, where T is the duration of time that a precharge-equalize (PRECH-EQ) signal stays high and Cbit is the capacitance associated with the bit-line of interest. As will be appreciated by those of skill in the art, this voltage droop reduces the noise margin.

To address this issue, the exemplary SRAM column 700 includes a leakage compensation circuit 715 including a PMOS leakage compensation transistor 718, a PMOS sample and hold switching transistor 720 and a capacitor 722. The SRAM column 700 of one embodiment also includes precharge and equalization circuitry 725 including precharge transistors 726 and 727, each of which has one terminal coupled to receive a $V_{CC}$ supply voltage, and an equalization transistor 728. The leakage compensation circuitry 715 and precharge and equalization circuitry 725 provide leakage compensation with full $V_{CC}$ precharge and also provide for evaluation to start from $V_{CC}$. In this manner, noise margins may be improved as compared to prior implementations.

Referring to FIGS. 7 and 8, in operation, in a first phase indicated in FIG. 8 by T1, precharge and equalization (PRECH-EQ) and sense enable (sense) signals are asserted. Asserting the PRECH-EQ signal causes the transistors 726–728 to be enabled to equalize and precharge the bit-lines to $V_{CC}$.

In response to asserting the SENSE signal, the sample and hold switching transistor 720 is enabled such that the gate and drain of the leakage compensation circuit 718 are shorted together to configure the circuit as an active load as described above in conjunction with other embodiments. In a second phase indicated by T2 in FIG. 8 and referred to herein as a sensing phase, as the PRECH-EQ signal is deasserted and the bit-lines are isolated from each other, the leakage compensation transistor 718 begins to supply the leakage current I1 on the BIT side. Again, due to the diode-connected configuration of the transistor 718, its gate is at the voltage necessary to supply the leakage current I1.

A third phase indicated by T3 in FIG. 8 is initiated as the SENSE signal is deasserted and the PRECH-EQ signal is again asserted to precharge and equalize the bit-lines following the sensing phase.

For most of the first three phases described above, a node $V_x$ at the source of the leakage compensation transistor 718 is coupled to receive the supply voltage $V_{CC}$. Just before a fourth phase (T4), which is an evaluation phase, however, a voltage $V_{CC}+V1$ that is higher than $V_{CC}$, is applied at the node $V_x$. For one embodiment, V1 is equal to the threshold voltage Vth of the transistor 718. Unlike the embodiment of FIG. 3, the voltage $V_{CC}+V1$ is not supplied by a separate voltage supply. The higher voltage may be provided, for example, by a charge pump or other voltage increasing circuitry.

Because an explicit capacitor 722 is included within the leakage compensation circuitry 715, in response to applying the higher voltage to the node $V_x$, the voltage at the node S is also higher such that the gate-to-drain voltage difference at the leakage compensation transistor 718 is held. The magnitude of the leakage compensation current I1 provided by the transistor 718 is determined by its gate-to-source voltage. Therefore, by applying the higher voltage at the node $V_x$, the transistor 718 is able to supply in an evaluation phase approximately the same current as it provided in the sensing phase.

Evaluation including reading a memory cell occurs in a similar manner as for the previously described embodiments. In the evaluation phase, in accordance with the above-described embodiment, the compensated current I1 substantially cancels the leakage current from the memory cells 705 such that the bit-line is able to hold at $V_{CC}$ when a memory cell storing a logical "1" is being read. Thus, using the leakage compensation approach of one embodiment, noise (voltage droop) at the bit-line being sensed is greatly reduced providing for higher skew towards PMOS in the sensing gate 707 at the targeted noise margin. As a result, performance may be improved as compared to other implementations that do not use such an approach.

For another embodiment, the leakage compensation approach described in reference to FIG. 7, may be applied to a differential memory. For such an embodiment, a column of memory may be configured in essentially the same manner as the column of memory shown in FIG. 3, except that the voltage supply $VI_C$ is replaced with the voltage supply $V_x$, which has the values described above in reference to FIG. 7.

As described above, for some embodiments, sensing and a second precharge and equalization operation may only be performed following a memory write operation and/or following a predetermined number of memory write operations.

A register file has a structure similar to SRAMs except that register memory cells are different. A similar approach may be applied to the bit-lines of a register file to substantially cancel out the bit-line leakage and reduce the voltage droop while reading a logic "1" from a register cell.

Figures 9, 10:
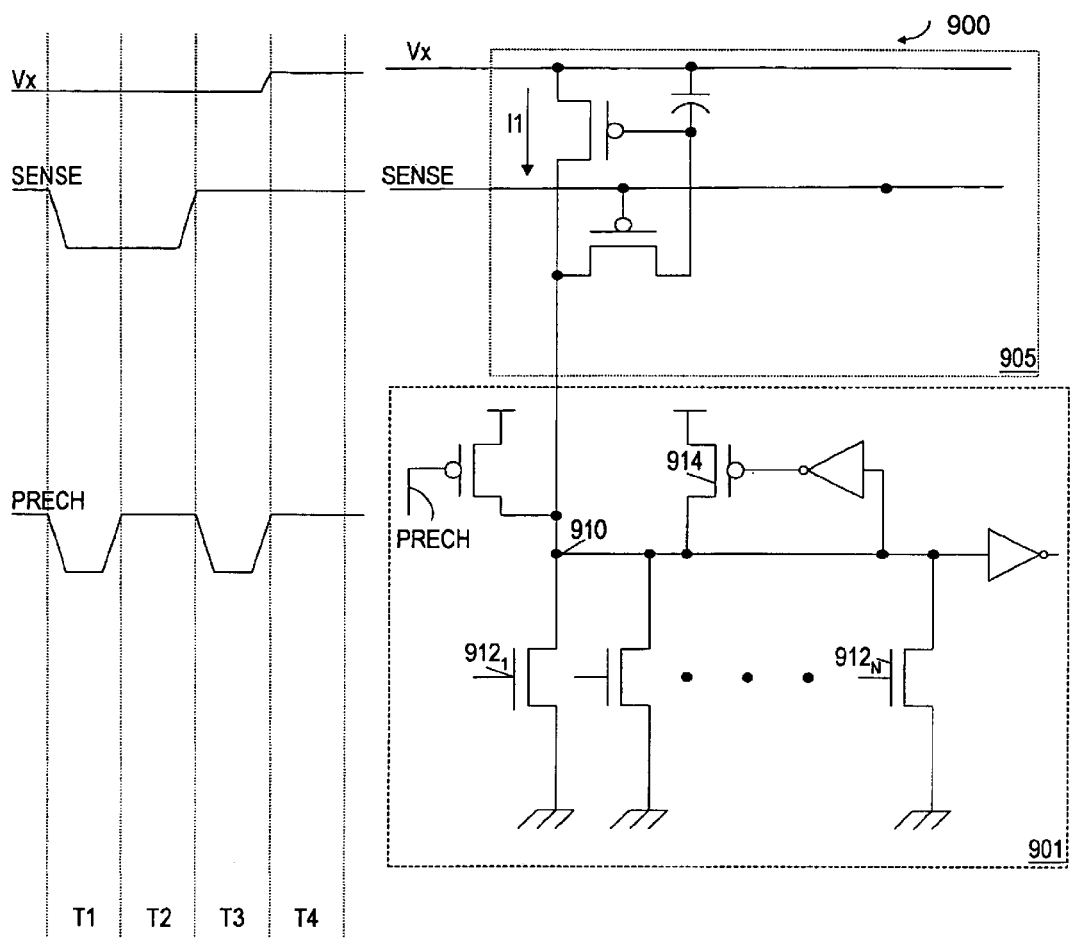
FIG. 9 is a schematic diagram of an exemplary domino OR gate of one embodiment that may advantageously use leakage compensation circuitry similar to that of FIG. 7.
FIG. 10 is a timing diagram showing exemplary control signal timings for the domino OR gate of FIG. 9.

A leakage compensation approach of one embodiment may also be applied to, for example, domino logic circuits with a wide-OR structure. An example of such a circuit 900 is shown in FIG. 9 while exemplary timings for the associated control signals are shown in FIG. 10.

An exemplary domino circuit 901 is an N-input domino OR circuit that may, for example, be used in a microprocessor or for another application. The robustness of the circuit 901 without leakage compensation circuitry 905 is questionable due to potentially large leakage when all inputs are at "0." Large leakage values may cause substantial voltage droop at a dynamic node 910 and, therefore, it may be difficult to maintain sufficient noise margin.

One approach to maintaining the desired noise margin, i.e. to keep noise under a given level, is to increase the threshold voltages of pull-down devices 912 and/or to have a large keeper transistor 914. Both such options may result in performance degradation of the domino circuit 901. By including the leakage compensation element 905, the noise margin is recovered for similar reasons as described above in reference to the SRAM of FIG. 7 without having to increase the size of the keeper transistor 914 or the threshold voltage of the pull-down devices 912. As a result, the circuit 900 including leakage compensation circuitry of one embodiment may have a higher performance as compared to similar domino circuits that do not use such a structure.

Figure 11:
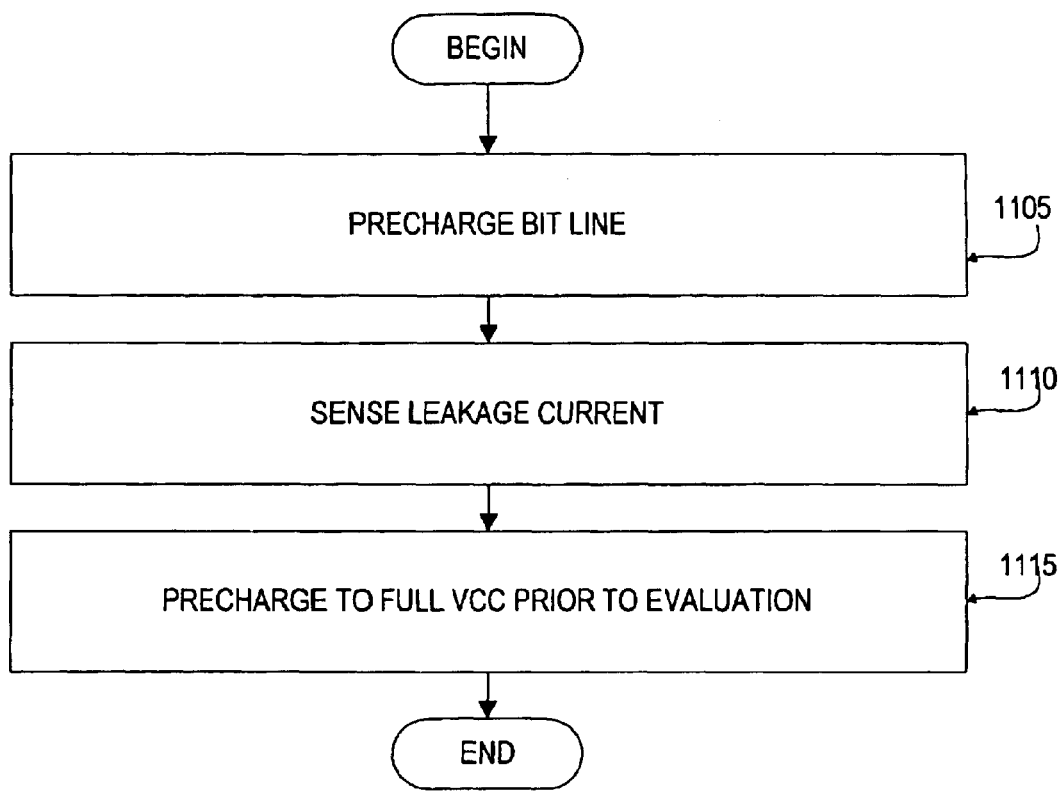
FIG. 11 is a flow diagram showing the method of one embodiment for SRAM bit-line compensation.

FIG. 11 is a flow diagram showing the method of one embodiment for bit line leakage compensation. At block 1105, a bit line is precharged and at block 1110, leakage current on the bit line is sensed. At block 1115, the bit line is precharged again such that it reaches a full $V_{CC}$ level. At block 1120, a memory access operation is performed.

It will be appreciated that, for some embodiments, additional and/or different actions may be performed.

In the foregoing specification, the invention has been described with reference to specific exemplary embodiments thereof. It will, however, be appreciated that various modifications and changes may be made thereto without departing from the broader spirit and scope of the invention as set forth in the appended claims. For example, complementary circuitry and/or signals may be provided for some embodiments. The specification and drawings are, accordingly, to be regarded in an illustrative rather than a restrictive sense.

What is claimed is:

1. An apparatus comprising:
a plurality of memory cells;
a pair of bit lines coupled to each of the plurality of memory cells;
a precharge circuit to precharge the pair of bit lines to substantially a full supply voltage level; and
a leakage compensation circuit to provide a first compensation current to a first one of the bit lines to substantially compensate for leakage current on the first bit line during a memory access operation directed to one of the plurality of memory cells.

2. The apparatus of claim 1 wherein the leakage compensation circuit comprises
a first sensing and leakage compensation transistor having a first terminal coupled to a first supply voltage line and a second terminal coupled to the first bit line,
a first sample and hold switching transistor having a first terminal coupled to a gate of the first sensing and leakage compensation transistor, a second terminal coupled to the first bit line and a gate coupled to receive a sense enable signal, and
a capacitor coupled to the first terminal of the first sample and hold switching transistor.

3. The apparatus of claim 2 wherein
the first supply voltage line is coupled to receive a voltage higher than the supply voltage at a time prior to an evaluation phase in which one of the plurality of memory cells is accessed.

4. The apparatus of claim 3 wherein
the voltage higher than the supply voltage is substantially equal to the supply voltage plus the threshold voltage of the first sensing and leakage compensation transistor.

5. The apparatus of claim 1 wherein,
the leakage compensation circuit is further to provide a second compensation current to a second one of the bit lines to substantially compensate for leakage current supplied by the second bit line during the memory access operation.

6. The apparatus of claim 5 wherein the leakage compensation circuit comprises
first and second sensing and leakage compensation transistors each having a first terminal coupled to a first supply voltage line, the first sensing and leakage compensation transistor having a second terminal coupled to the first bit line, the second sensing and leakage control transistor having a second terminal coupled to the second bit line,
first and second sample and hold switching transistors each having a gate coupled to receive a sense enable signal, the first sample and hold switching transistor having a first terminal coupled to a gate of the first sensing and leakage compensation transistor and a second terminal coupled to the first bit line, the second sample and hold switching transistor having a first terminal coupled to a gate of the second sensing and leakage compensation transistor and a second terminal coupled to the second bit line, and
first and second capacitors, the first capacitor being coupled to the first terminal of the first sample and hold switching transistor, the second capacitor being coupled to the first terminal of the second sample and hold switching transistor.

7. An apparatus comprising:
a static random access memory (SRAM) including
a plurality of memory cells coupled between first and second bit lines;
a first precharge and leakage compensation circuit to precharge at least a first one of the bit lines to substantially a full $V_{CC}$ level immediately prior to a leakage sensing phase, the first precharge and leakage compensation circuit further to supply a first compensation current to the at least first bit lines to substantially compensate for leakage current on the at least first bit line during a memory access operation.

8. The apparatus of claim 7 wherein the first precharge and leakage compensation circuit includes
a first leakage sensing and compensation transistor having a first terminal coupled to receive a first supply voltage higher than $V_{CC}$ and a second terminal coupled to the at least first bit line,
a first sample and hold transistor having a first terminal coupled to the at least first bit line, a second terminal coupled to a gate of the first precharge and leakage compensation transistor and a gate coupled to receive a sense enable signal, and
a capacitor having one terminal coupled to the second terminal of the first sample and hold transistor and another terminal coupled to receive the first supply voltage.

9. The apparatus of claim 8 wherein
the SRAM includes single-ended memory cells.

10. The apparatus of claim 8 wherein
the SRAM includes differential memory cells and a second precharge and leakage compensation circuit coupled to the other bit line.

11. The apparatus of claim 8 wherein the first precharge and leakage compensation circuit further includes
a precharge and equalization circuit coupled between the first and second bit lines, the precharge and equalization circuit including at least a first precharge transistor having one terminal coupled to receive a $V_{CC}$ supply voltage.

12. A method comprising:
precharging a bit line in a memory;
sensing a leakage current on the bit line; and
precharging the bit line following sensing to a substantially full $V_{CC}$ level prior to evaluating the bit line in response to a memory access operation directed to the memory.

13. The method of claim 12 further comprising:
during the memory access operation, supplying a leakage compensation current to the bit line that is substantially equivalent to a leakage current on the bit line.

14. A system comprising:
a bus to communicate information;
a battery coupled to the bus to power the system in the absence of an external power source; and
a processor coupled to the bus to execute instructions, the processor including a static random access memory (SRAM), the SRAM comprising:
a plurality of memory cells coupled between first and second bit lines;
a first precharge and leakage compensation circuit to precharge at least a first one of the bit lines to substantially a full $V_{CC}$ level immediately prior to a leakage sensing phase, the first precharge and leakage compensation circuit further to supply a first compensation current to the at least first bit lines to substantially compensate for leakage current on the at least first bit line during a memory access operation.

15. The system of claim 14 wherein the SRAM further includes
- a second precharge and leakage compensation circuit to precharge a second one of the bit lines to substantially the full $V_{CC}$ level immediately prior to a leakage sensing phase, the second precharge and leakage compensation circuit further to supply a second compensation current to the second bit line to substantially compensate for leakage current on the second bit line during a memory access operation.

16. The system of claim 15 wherein each of the first and second precharge and leakage compensation circuits includes
- a leakage sensing and compensation transistor having a first terminal coupled to receive a first voltage higher than $V_{CC}$ and a second terminal coupled to the respective line,
- a sample and hold transistor having a first terminal coupled to the respective bit line, a second terminal coupled to a gate of the respective precharge and leakage compensation transistor and a gate coupled to receive a sense enable signal, and
- a capacitor having one terminal coupled to the second terminal of the respective sample and hold transistor and another terminal coupled to receive the first supply voltage.

17. The system of claim 16 wherein each of the first and second precharge and leakage compensation circuits includes
- a precharge and equalization circuit including at least a first precharge circuit having a terminal coupled to receive a $V_{CC}$ supply voltage.

* * * * *

UNITED STATES PATENT AND TRADEMARK OFFICE
CERTIFICATE OF CORRECTION

PATENT NO. : 6,801,463 B2
DATED : October 5, 2004
INVENTOR(S) : Khellah et al.

It is certified that error appears in the above-identified patent and that said Letters Patent is hereby corrected as shown below:

Column 8,
Line 59, delete "$COL_{13}$" and insert -- $COL\_$ --.

Column 13,
Line 14, before "voltage", insert -- supply --.
Line 16, before "line", insert -- bit --.

Signed and Sealed this

Tenth Day of May, 2005

JON W. DUDAS
*Director of the United States Patent and Trademark Office*